United States Patent Office 3,493,380
Patented Feb. 3, 1970

3,493,380

PHOTORESIST COMPOSITION

Frederick J. Rauner and Lawrence E. Martinson, Rochester, N.Y., assignors to Eastman Kodak Company, Rochester, N.Y., a corporation of New York No Drawing. Filed July 1, 1966, Ser. No. 562,105
Int. Cl. G03c *1/70, 1/94*
U.S. Cl. 96—115 17 Claims This invention relates to light sensitive coatings and in particular to improved light sensitive polymers containing cinnamoyl groups.

It is well known in the art of photomechanical reproduction to utilize various light sensitive ethylenically unsaturated linear polymers for forming resist images upon various supports, such as metal plates. The support is then etched or otherwise treated in the areas not covered by the resist image and the resultant plate, usually after removal of the resist image, is used for printing. Particularly useful light sensitive materials include polymers containing cinnamoyl groups. Typical compounds of this type have been described in U.S. Patents 2,670,285–7; 2,725,-372; 2,690,966; 2,697,039, etc. In general, these patents disclose solvent soluble polymeric materials containing combined polymeric units having $$R—(CH{=}CH)_n—CO— \text{groups}—n=1 \text{ or } 2$$

wherein R is an aryl group such as phenyl, m-nitrophenyl, etc. Particularly efficacious polymers having this polymeric unit are cinnamic acid esters of polyvinyl alcohols, starch, cellulose, etc., as well as partially alkylated cellulose or polyvinyl alcohol, either completely or partially hydroxy-akylated cellulose or polyvinyl alcohol, and partially esterified cellulose or polyvinyl alcohol. The photosensitization of such polymers with nitro-, triphenyl methane, anthrone, quinone, and ketone compounds is advantageous.

The light sensitive compositions containing the polymer and the sensitizing agent are useful particularly in the photographic art wherein they can be utilized to form insoluble polymeric images on various supports. For this purpose, the light sensitive polymers and sensitizing agents are dissolved in an organic solvent medium, for example, ethylene glycol monomethyl ether acetate. In the case of cinnamic acid esters of polyvinyl alcohol using from about 2–25% of the sensitizing agent based upon the weight of polymer present, the resulting dope is then uniformly coated on the desired surface, exposed with light to the subject to insolubilize the coating in the exposed region, followed by washing away the unexposed coating with organic solvent. The solvents used in this process will vary somewhat with the particular polymer employed; however, for the polyvinyl cinnamates, solvents disclosed in the Minsk et al. U.S. Patent 2,670,286 are useful and the composition can be put to the same uses noted in that patent.

Some applications require thick coatings which introduce the need for an improved resist since the developing operations on thick coatings puts a heavy demand on the swelling-solubility properties of the polymer. In some applications wherein coatings as thick as 0.6 mil dry thickness are desirable, difficulty has been encountered during processing because the entire resist layer tends to be removed. This is particularly evident when trichloroethylene is employed as the solvent used in processing the exposed resist layer.

We have found that the addition of a phenolic resin to the light sensitive resin containing cinnamoyl groups improves the swelling-solubility characteristics, particularly when employed in relatively thick coatings and when the processing is carried out in a vapor degreaser. The phenolic resin may also be used with sensitized rubber resist compositions.

One object of this invention is to provide an improved photoresist, comprising light sensitive polymers containing cinnamoyl groups and a phenolic resin. Another object is to provide heavy coatings of a photoresist which can be processed in a vapor degreaser without the entire coating swelling and coming off the support. A further object is to provide a photoresist having good adhesion during the etching operation. A still further object is to provide a method of making a photoresist which permits the use of relatively thick coatings. Another object is to provide sensitized rubber resist compositions containing phenol formaldehyde resins.

The above objects are attained by combining a phenolic resin, such as those identified as novolac resins with light sensitive polymers containing cinnamoyl groups, cinnamylidene groups or with light sensitive rubber compositions.

In one embodiment of the invention, polyvinyl cinnamate sensitized with 2-benzoylmethylene-1-methyl-naphtho-thiazoline is combined with a thermo-plastic novolac resin in a solvent mixture of monochlorobenzene and cyclohexanone. After coating on a copper surface, the light sensitive resist is exposed to a light image and put into a vapor degreaser where trichloroethylene spray and vapor acts on the resist image. The non-image areas are completely removed whereas the image areas are glossy and have good adhesion to the substrate.

The novolac resins are prepared by the condensation of phenols and aldehydes under acidic conditions. Less than 6 moles of formaldehyde are used per 7 moles of phenol to provide products which are permanently fusible and soluble. The following illustrates the novolac condensation products of phenol with formaldehyde:

(a)

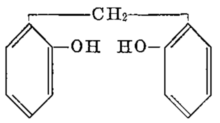

(b)

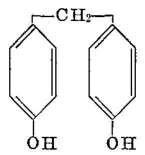

(c)

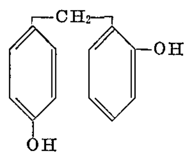

The novolac compound can be further reacted with formaldehyde or with a methylol yielding compound such as hexamethylene tetramine. In a typical synthesis, novolacs are prepared by heating 1 mole of phenol with 0.5 mole of formaldehyde under acidic conditions. The temperatures at which the reaction is conducted are generally from about 25° C. to about 175° C.

The novolac resins are prepared by the condensation of phenol with formaldehyde, more generally by the reaction of a phenolic compound having two or three reactive aromatic ring hydrogen positions with an aldehyde or aldehyde-liberating compound capable of undergoing phenol-aldehyde condensation. Illustrative of particularly useful phenolic compounds are cresol, xylenol, ethylphenol, butylphenol, isopropylmethoxyphenol, chlorophenol, resorcinol, hydroquinone, naphthol, 2,2-bis(p-hydroxyphenyl) propane and the like.

Illustrative of especially efficacious aldehydes are formaldehyde, acetaldehyde, acrolein, crotonaldehyde, furfural and the like. Illustrative of aldehyde-liberating compounds are hexamethylenetetramine, 1,3,5-trioxane, etc. Ketones such as acetone are also capable of condensing with the phenolic compounds.

The most suitable novolac resins are those which are insoluble in water and trichloroethylene but readily soluble in conventional organic solvents such as methylethyl ketone, acetone, methanol, ethanol, etc. Novolac resins having a particularly desirable combination of properties are those which have an average molecular weight in the range between about 350 and 600.

It is to be understood that the term novolac resins as used herein, indicates those resins which can be incorporated with the light sensitive polymers; those novolac resins which can be used are those which are either heat fusible or solvent soluble, which permit admixture and association.

The light sensitive polymers containing cinnamoyl groups include those referred to in the above-described patents and include those which have been photosensitized with various compounds, extending the light sensitivity beyond that of the light sensitive composition used alone. For instance, polyvinyl cinnamate devoid of sensitizing agent, is sensitive principally to wavelengths of light in the ultraviolet regions of the spectrum up to about 365 millimicrons. When 2-benzoylmethylene-1-methyl-β-naphthiazoline is, for example, employed as a sensitizing agent for polyvinyl cinnamate, the light sensitivity is extended to at least 435 millimicrons. The use of the particular sensitizing agent is a matter of choice and does not significantly affect the swelling-solubility properties of our improved photoresist composition.

The amount of novolac added to the light sensitive polymer containing cinnamoyl groups may be varied between about 2 to 15% on the weight basis of the light sensitive polymer containing cinnamoyl groups. Eight percent is a particularly useful amount, but the amount used depends upon the thickness of the intended coating. The thickness of coatings is a matter of choice but may be between 0.2 mil and about 1.0 mil in thickness.

Typical light sensitive cinnamic acid esters may be obtained by esterification of hydroxy containing materials such as cellulose, polyvinyl alcohol, starch, partially alkylated cellulose or polyvinyl alcohol, completely or partially hydroxy alkylated cellulose or of polyvinyl alcohol or of partially esterified cellulose or polyvinyl alcohol, etc. The esterification may be carried out with a cinnamic acid halide such as o-chloro or m-nitro cinnamic acid chlorides. Cinnamic acid esters of varying acyl content may be prepared by deacylation of substantially fully esterified cinnamic acid esters. Particularly useful solvent soluble esters contain from about 60 to 100 mole percent cinnamic ester. Other polymeric materials containing cinnamoyl groups may be formed, such as, for example, cinnamoyl polystyrene resins, etc.

Certain other photoresist materials are also useful in this invention including those which are sensitized rubber compositions. For instance, resist materials comprising organic solvent soluble colloid materials containing substantially no polar groupings such as natural rubber, synthetic rubber, cyclized rubber, oxidized rubber, etc., which have been sensitized with a water-insoluble aryl azide compound, may be combined with novolac resins in the same way as these cinnamic acid esters. Typical sensitized rubber resist materials are disclosed in U.S. Patent 2,852,379.

The following examples are intended to illustrate our invention but not to limit it in any way.

EXAMPLE 1

A solution was prepared as follows:

| | | |
|---|---|---|
| Polyvinyl cinnamate | grams | 208.0 |
| 2-benzoylmethylene-1-methyl-β-naphthothiazoline | do | 2.1 |
| Hydroquinone | do | 1.0 |
| Monochlorobenzene | cc | 1600.0 |
| Cyclohexanone | cc | 500.0 |

The above solution was whirl-coated at 70 r.p.m. onto a copper surface. The dried coating was 0.6 milliliter thick.

It was exposed through a transparency to an arc lamp to 2000 foot-candles for 1 minute. The plate was then put into a vapor degreaser where trichloroethylene spray and vapor acted on the resist image. After 30 seconds, most of the coating had been removed. There was extremely poor adhesion in the areas of optimum exposures.

To a coating solution of the above composition, 16 grams of a thermoplastic novolac resin were added.

A coating was prepared at the same thickness and exposed and processed as before. After 30 seconds in the degreaser, the non-image areas was well developed (resist had been removed) and the image areas were glossy and had good adhesion to the substrate.

EXAMPLE 2

Similar results were obtained using 4 grams and 30 grams of the novolac resin in the above composition.

EXAMPLE 3

A typical light sensitive resist lacquer useful for forming resist images is compounded of the following material as described in U.S. Patent 2,670,285:

| | | |
|---|---|---|
| Polyvinyl cinnamate | grams | 2.5 |
| Methyl glycol acetate | cc | 100.0 |
| Sensitizer compound (9-anthrone) | grams | 0.25 |

To the above solution are added .05 grams of novolac, Resin SP–6701, sold by Schenectady Chemicals Inc., Schenectady, N.Y. Satisfactory results are obtained when this mixture is used to form a resist on a zinc support by spray application.

EXAMPLE 4

Novolac resin is added to various solvent soluble light sensitive polymeric materials containing the cinnamoyl groups in an amount of 2 to 15% on the weight basis of the light sensitive polymeric materials containing the cinnamoyl groups. These light sensitive polymers include cinnamoyl polystyrene resins, polyvinyl m-nitro cinnamate, partially esterified cellulose cinnamate, polyvinyl acetate cinnamate, cellulose acetate cinnamates, cinnamic acid esters of starch, etc. The mixture is dissolved in a suitable organic solvent depending upon the particular cinnamic acid ester used and coated on a support. The coatings are applied to give a thickness of 0.5 mil when dry.

The dried coatings are exposed to a light image and developed in a vapor degreaser in which a light spray of solvent followed by hot solvent vapor of trichloroethylene is applied to the surface of the coatings. The unexposed areas are removed in the vapor degreaser. If desired, a postbake treatment may be given by heating at a temperature of 121° C. to 260° C. for about ten minutes to remove residual solvents.

In an alternative development method, the exposed resist is soaked in a tank of developer comprising a suitable solvent for the selected photoresist material and spray rinsed with a mixture of the solvent and ethyl alcohol.

Next the resist is sprayed with water at room temperature followed by a second water wash with warm water to facilitate the drying of the image.

If a dye resist image is desired, the surface may be immersed in a dye solution for a short period of time, such as about 30 seconds. Alternatively, the dye can be flowed onto the surface.

EXAMPLE 5

The solution is prepared as follows:

| | Parts |
|---|---|
| Cyclized rubber | 5.00 |
| Xylene | 100.00 |
| Monochlorobenzene | 100.00 |
| Novolac resin | 0.36 |
| 4,4'-diazidostilbene | 0.5 |

The mixture is coated onto a sheet of copper by pouring. When dry, the layer is exposed in contact with a halftone transparency to mercury vapor illumination for three minutes at 18" from two 400-watt high-pressure mercury vapor tubes.

After exposure, the plate is placed in a dish or tank containing trichloroethylene and agitated for approximately two minutes whereupon the unexposed resist is removed. The image remaining on the plate is then rinsed with clean solvent and dried. A satisfactory resist is obtained.

Copper surfaces are disclosed in Examples 1, 2 and 5 as typical of those which may be used as supports for the photoresists of our invention. However, other plates, for example, made of zinc, magnesium, stainless steel, bimetals, aluminum, etc. are equally useful and may be used. Moreover, conventional supports used for photographic emulsions may be used such as, for example, paper, glass, cellulose esters, polymeric supports, such as polyolefins, polyesters, polyamides, etc.

In some cases, it may be desirable to add a plasticizer to the resist formulation, particularly in those cases where the resist is to be used on a flexible support. Such plasticizers as chlorinated biphenyls, dibutyl phthalates, tricresyl phosphates, diglycol laurates, etc., may be used in a range up to 30% based on the weight of the light sensitive polymer.

The invention has been described in detail with particular reference to preferred embodiments thereof, but it will be understood that variations and modifications can be effected within the spirit and scope of the invention as described hereinabove and as defined in the appended claims.

We claim:

1. A photosensitive polymeric coating composition comprising (1) a phenolic resin, and (2) an organic solvent soluble, light-sensitive, polymeric material selected from the group consisting of (a) photoinsolubilizable cinnamic acid esters of hydroxyl containing linear polymers, and (b) photoinsolubilizable aryl azide sensitized rubber materials.

2. A photosensitive polymeric coating composition as defined in claim 1 wherein the phenolic resin is a thermoplastic novolac resin present in amount of about from 2 to 15 percent by weight of the light-sensitive polymeric material.

3. A photosensitive polymeric coating composition as defined in claim 1 wherein the phenolic resin is a trichloroethylene insoluble phenolic resin present in amount from 2 to 15 percent by weight of the light-sensitive polymeric material.

4. A photosensitive polymeric coating composition as defined in claim 3 wherein the light-sensitive polymeric material is selected from the group consisting of polyvinyl cinnamate, polyvinyl m-nitro cinnamate, polyvinyl acetate cinnamate, cellulose acetate cinnamate and hydroxyethylcellulose cinnamate.

5. A photosensitive polymeric coating composition as defined in claim 3 wherein the light-sensitive polymeric material is selected from the group consisting of aryl azide sensitized natural rubbers, aryl azide sensitized synthetic rubbers, aryl azide sensitized cyclized rubbers and aryl azide sensitized oxidized rubbers.

6. A photosensitive polymeric coating composition as defined in claim 4 wherein the phenolic resin is a thermoplastic novolac resin obtained by condensing formaldehyde with a molar excess of cresol under acidic conditions and is present in amount of about from 2 to 15 percent by weight of the light-sensitive polymeric material.

7. A photosensitive polymeric coating composition as defined in claim 5 wherein the phenolic resin is a thermoplastic novolac resin obtained by condensing formaldehyde with a molar excess of cresol under acidic conditions and is present in amount of about from 2 to 15 percent by weight of the light-sensitive polymeric material.

8. A photosensitive polymeric coating composition comprising (1) a polyvinyl cinnamate, and (2) a thermoplastic, trichloroethylene insoluble novolac resin present in amount of about from 2 to 15 percent by weight of the polyvinyl cinnamate.

9. A photosensitive polymeric coating composition comprising (1) an aryl azide sensitized cyclized rubber, and (2) a thermoplastic, trichloroethylene insoluble novolac resin present in amount of about from 2 to 15 percent by weight of the cyclized rubber.

10. Aphotosensitive element comprising a support on which is coated a layer of a photosensitive composition comprising (1) a phenolic resin, and (2) an organic solvent soluble, light-sensitive, polymeric material selected from the group consisting of (a) photoinsolubilizable cinnamic acid esters of hydroxyl containing linear polymers, and (b) photoinsolubilizable aryl azide sensitized rubber materials.

11. A photosensitive element as defined in claim 10 wherein the phenolic resin is a thermoplastic novolac resin present in amount of about from 2 to 15 percent by weight of the light-sensitive polymeric material.

12. A photosensitive element as defined in claim 10 wherein the light-sensitive polymeric material is selected from the group consisting of polyvinyl cinnamate, polyvinyl m-nitro cinnamate, polyvinyl acetate cinnamate, cellulose acetate cinnamate and hydroxyethylcellulose cinnamate.

13. A photosensitive element as defined in claim 10 wherein the light-sensitive polymeric material is selected from the group consisting of aryl azide sensitized natural rubbers, aryl azide sensitized synthetic rubbers, aryl azide sensitized cyclized rubbers and aryl azide sensitized oxidized rubbers.

14. A photosensitive element as defined in claim 10 wherein the support is metal.

15. A photosensitive element as defined in claim 14 wherein the support is selected from the group consisting of copper, zinc and aluminum.

16. A photosensitive element comprising a metallic support on which is coated a layer of a photosensitive composition comprising (1) a polyvinyl cinnamate, and (2) a thermoplastic, trichloroethylene insoluble novolac resin present in amount of about from 2 to 15 percent by weight of the polyvinyl cinnamate.

17. A photosensitive element comprising a metallic support on which is coated a layer of a photosensitive composition comprising (1) an aryl azide sensitized cyclized rubber, and (2) a thermoplastic, trichloroethylene insoluble novolac resin present in amount of about from 2 to 15 percent by weight of the cyclized rubber.

References Cited

UNITED STATES PATENTS

| | | | |
|---|---|---|---|
| 2,852,379 | 9/1958 | Hepher et al. | 96—91 |
| 3,019,106 | 12/1962 | Adams | 96—33 |
| 3,387,976 | 6/1968 | Sorkin | 96—115 |
| 2,725,372 | 11/1955 | Minsk | 96—115 |
| 2,690,966 | 10/1954 | Minsk et al. | 96—115 |

NORMAN G. TORCHIN, Primary Examiner

ROBERT LYON, Assistant Examiner

U.S. Cl. X.R.

96—36, 86